US012796392B2

(12) United States Patent
Min et al.

(10) Patent No.: US 12,796,392 B2
(45) Date of Patent: Nov. 10, 2026

(54) PHOTOSENSITIVE TRANSFER RESIN FOR TRANSFERRING AN LED CHIP, A METHOD OF TRANSFERRING AN LED CHIP USING THE PHOTOSENSITIVE TRANSFER RESIN, AND A METHOD OF MANUFACTURING A DISPLAY DEVICE USING THE SAME

(71) Applicant: AGASemicon Corp., Yongin-si (KR)

(72) Inventors: Jae Sik Min, Yongin-si (KR); Jae Yeop Lee, Yongin-si (KY); Jae Suk Park, Yongin-si (KR); Byoung Gu Cho, Yongin-si (KR)

(73) Assignee: AGASemicon Corp., Yongin-si (KR)

( * ) Notice: Subject to any disclaimer, the term of this patent is extended or adjusted under 35 U.S.C. 154(b) by 879 days.

(21) Appl. No.: 17/617,561

(22) PCT Filed: Apr. 15, 2021

(86) PCT No.: PCT/KR2021/004734
§ 371 (c)(1),
(2) Date: Dec. 8, 2021

(87) PCT Pub. No.: WO2021/215741
PCT Pub. Date: Oct. 28, 2021

(65) Prior Publication Data

US 2022/0254673 A1 Aug. 11, 2022

(30) Foreign Application Priority Data

Apr. 21, 2020 (KR) ........................ 10-2020-0047960

(51) Int. Cl.
*H10P 72/70* (2026.01)
*H10H 20/01* (2025.01)
(Continued)

(52) U.S. Cl.
CPC ............. *H10P 72/74* (2026.01); *H10W 90/00* (2026.01); *H10H 20/01* (2025.01); *H10H 20/018* (2025.01);
(Continued)

(58) Field of Classification Search
CPC ..................... H01L 2221/68318–68386; H01L 2224/93–95001;
(Continued)

(56) References Cited

U.S. PATENT DOCUMENTS 5,206,348 A * 4/1993 Jacovich ................. G03F 7/022 430/326
5,316,849 A * 5/1994 Lu ...................... A44B 18/0003 24/584.1
(Continued)

FOREIGN PATENT DOCUMENTS

CN 110797295 A 2/2020
EP 0917000 A2 5/1999
(Continued)

OTHER PUBLICATIONS

Benzoin Isopropyl Ether Safety Data Sheet, Sigma-Aldrich, revised 2024, p. 4 (Year: 2024).*
(Continued)

*Primary Examiner* — Julio J Maldonado
*Assistant Examiner* — Eric Manuel Mulero Flores
(74) *Attorney, Agent, or Firm* — AJU IP Global PLLC

(57) ABSTRACT

The present invention relates to a photosensitive transfer resin, an LED chip transfer method, and a method for manufacturing a display device, to which are applied a technique for etching and separating LED chips formed on a wafer and transferring each of the separated chips to a carrier substrate, and a technique for using the photosensitive transfer resin to selectively transfer a portion of each of
(Continued)

the chips transferred to the carrier substrate to another carrier substrate and a display panel in succession or at intervals. A photosensitive transfer resin for transferring an LED chip according to an embodiment of the present invention is prepared by mixing a photosensitive resin and a photoactive agent solution obtained by mixing a solvent and a photoactive agent powder. The photosensitive transfer resin can be expanded by heating without a development process following exposure, and thereby be used for peeling or transferring LED chips adhered to the photosensitive transfer resin.

4 Claims, 9 Drawing Sheets

(51) Int. Cl.
*H10W 72/00* (2026.01)
*H10W 90/00* (2026.01)

(52) U.S. Cl.
CPC ...... *H10P 72/7414* (2026.01); *H10P 72/7434* (2026.01); *H10P 72/7442* (2026.01); *H10W 72/0198* (2026.01); *H10W 72/07307* (2026.01); *H10W 72/07336* (2026.01); *H10W 90/732* (2026.01)

(58) Field of Classification Search
CPC ........................ H01L 2224/8185–81874; H01L 2924/06–0715; H01L 2924/0782; H01L 2021/6006; H01L 2221/68363; H01L 2221/68368; C09J 7/38–387; C09J 2301/302; C09J 5/08; C09J 7/35; G03F 7/0751; G03F 7/085; H10W 72/07338; H10W 72/07337; H10W 72/354; H10W 72/353; H10W 72/30–387; H10P 72/7402–7406; H10P 72/7414; H10P 72/744; H10P 72/10–1928; H10P 76/20; H10P 76/204; H10P 76/40; H10P 76/405; H10P 76/408; H10P 76/4083; C08J 2363/04
See application file for complete search history.

(56) References Cited

U.S. PATENT DOCUMENTS

| | | | | |
|---|---|---|---|---|
| 2003/0087476 A1* | 5/2003 | Oohata | G09F 9/33 | 438/455 |
| 2007/0036930 A1* | 2/2007 | Kontani | B32B 7/12 | 428/40.1 |
| 2009/0197295 A1* | 8/2009 | Fournier | H01J 49/0004 | 250/281 |
| 2011/0076490 A1* | 3/2011 | Higashibeppu | B23K 26/40 | 156/60 |
| 2017/0077186 A1* | 3/2017 | Tallal | H10K 39/36 | |
| 2018/0096877 A1* | 4/2018 | Horibe | H01L 25/50 | |

FOREIGN PATENT DOCUMENTS

| | | |
|---|---|---|
| JP | H11142878 A | 5/1999 |
| JP | 2002198569 A | 7/2002 |
| JP | 2003077940 A | 3/2003 |
| JP | 2005011579 A | 1/2005 |
| JP | 2019015899 A | 1/2019 |
| KR | 100853410 B1 | 8/2008 |

OTHER PUBLICATIONS

"3-Diazo-3,4-dihydro-4-oxonaphthalene-1-sulfonyl chloride Product Specification", Sigma-Aldrich, retrieved 2026 (Year: 2026).*
"What happens on exposure" p. 626, The molecular mechanism of novolak-diazonaphthoquinone resists, Reiser et al., May 2001 (Year: 2001).*
Chinese Office Action 202180003734.3, Issued Jul. 25, 2024.
Office Action issued by the CNIPA on Dec. 20, 2024.

* cited by examiner

[Fig. 3]
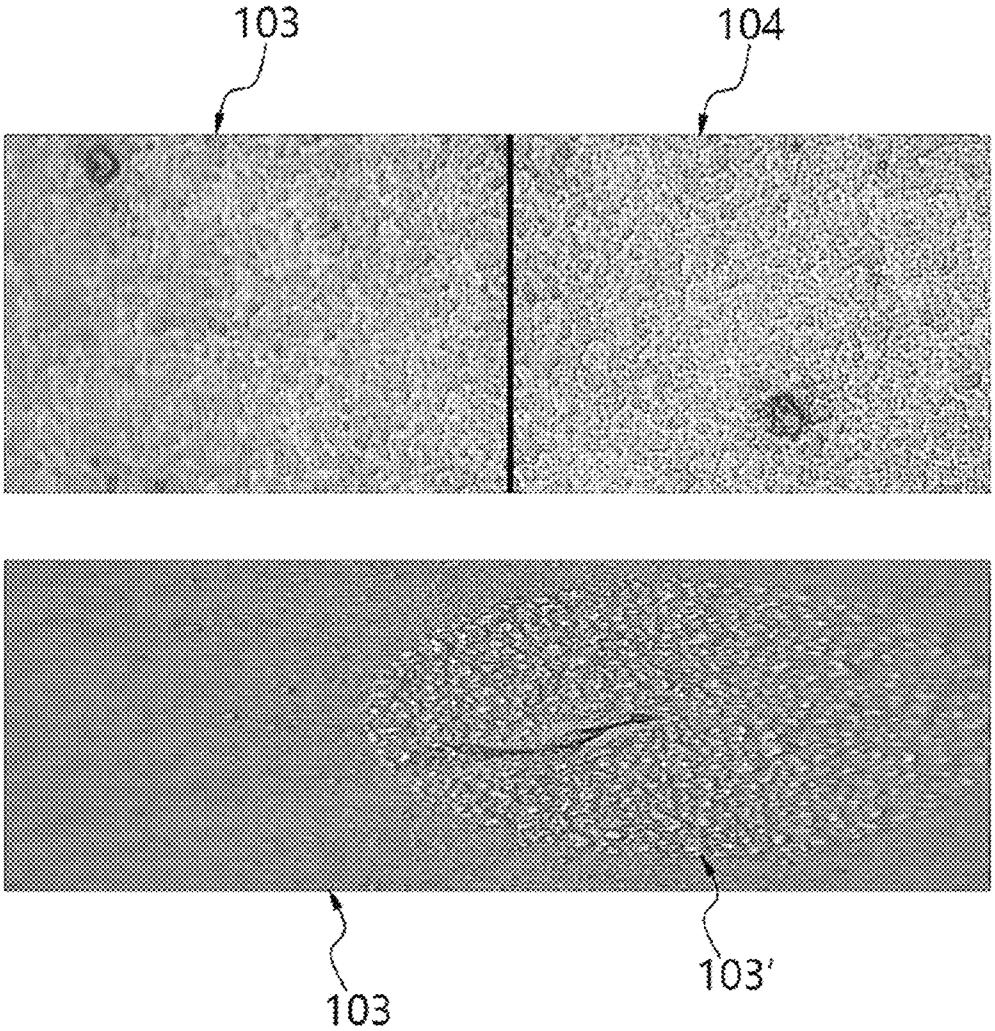

[Fig. 5]
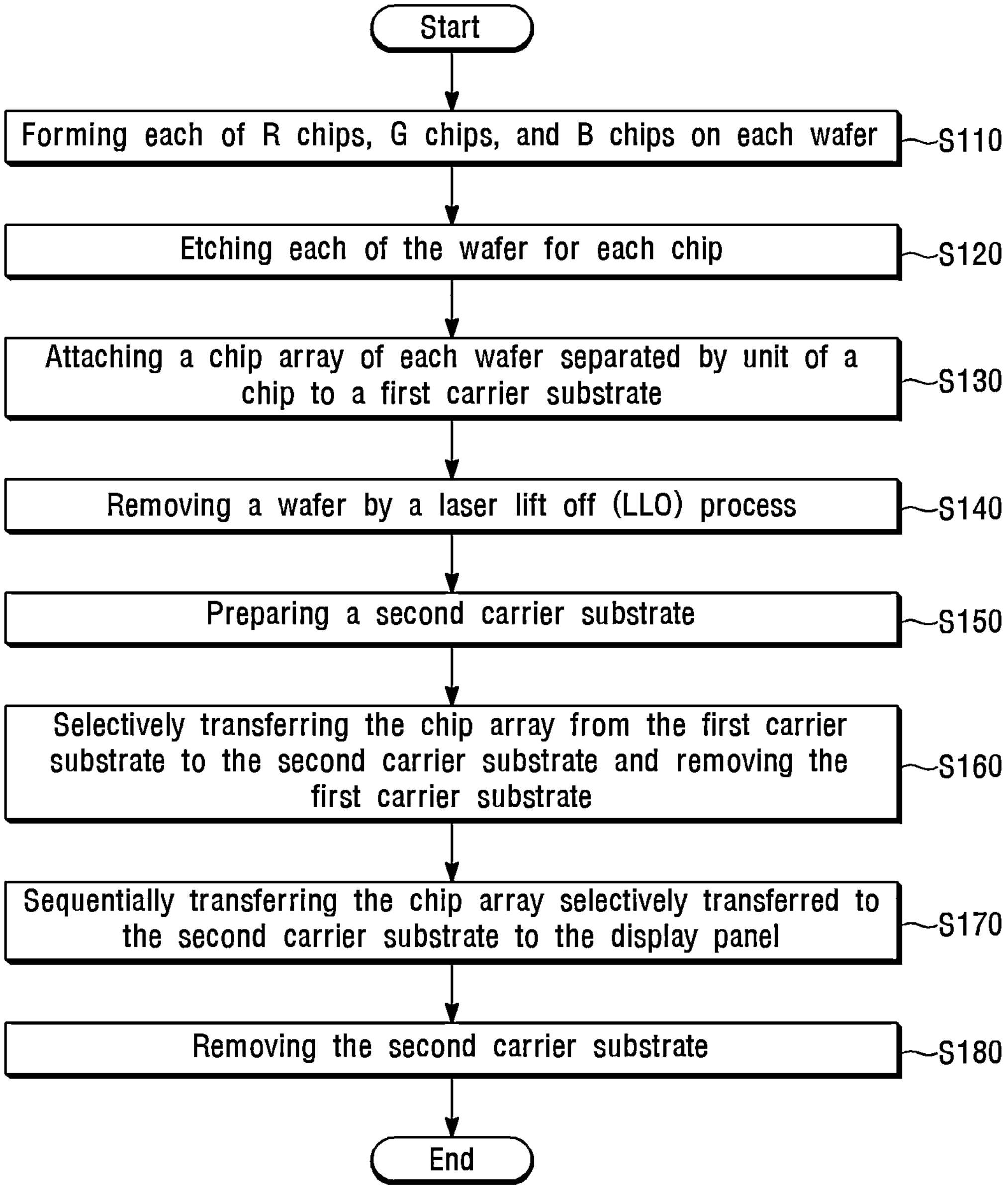

[Fig. 6]
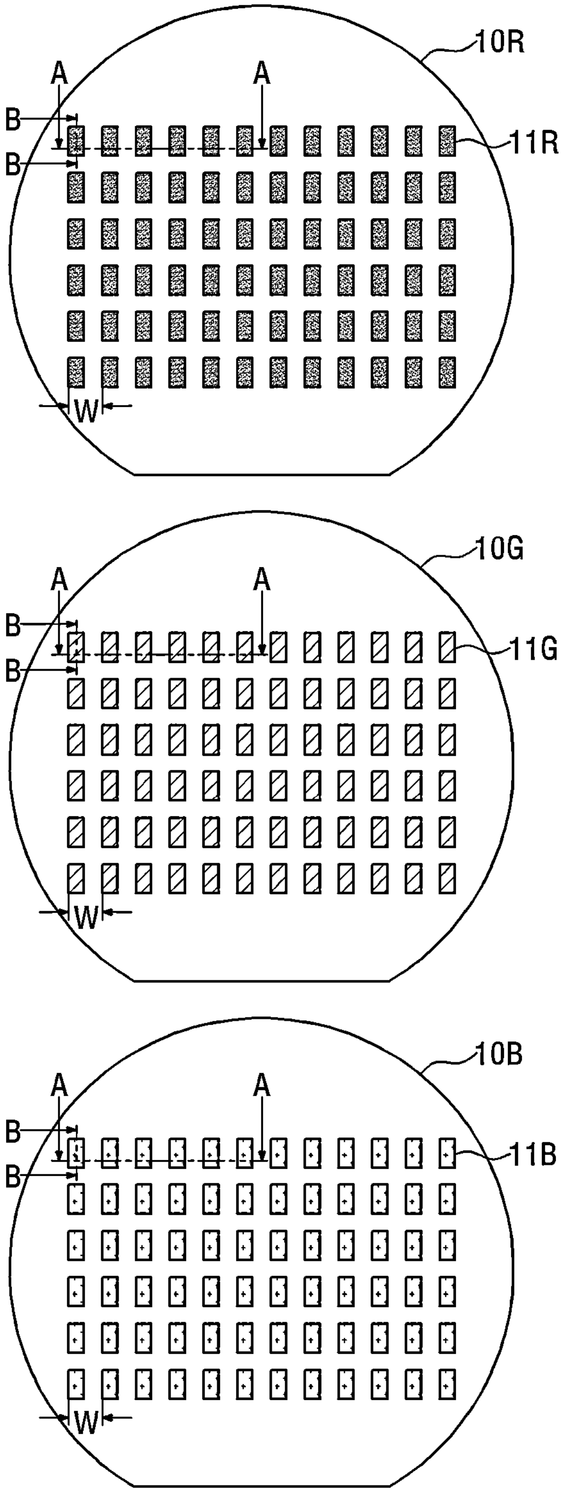

[Fig. 7]
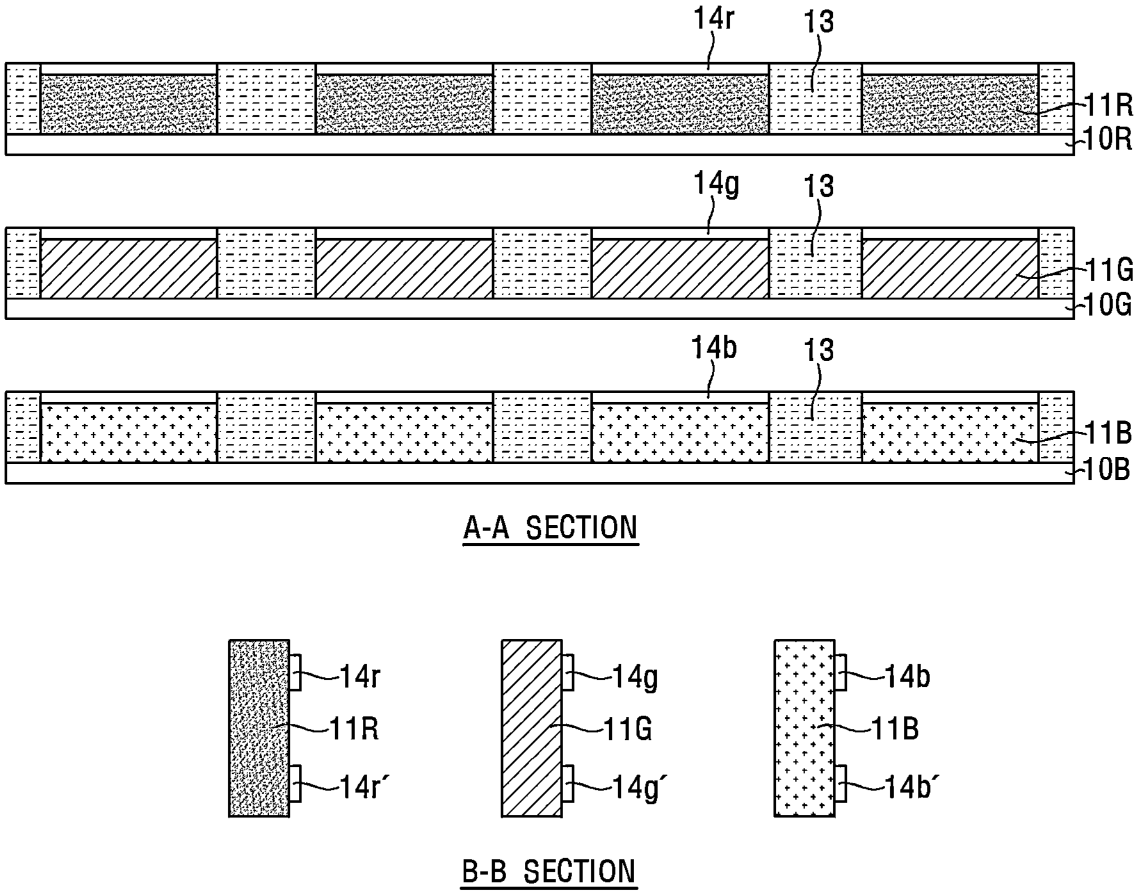
[Fig. 8]
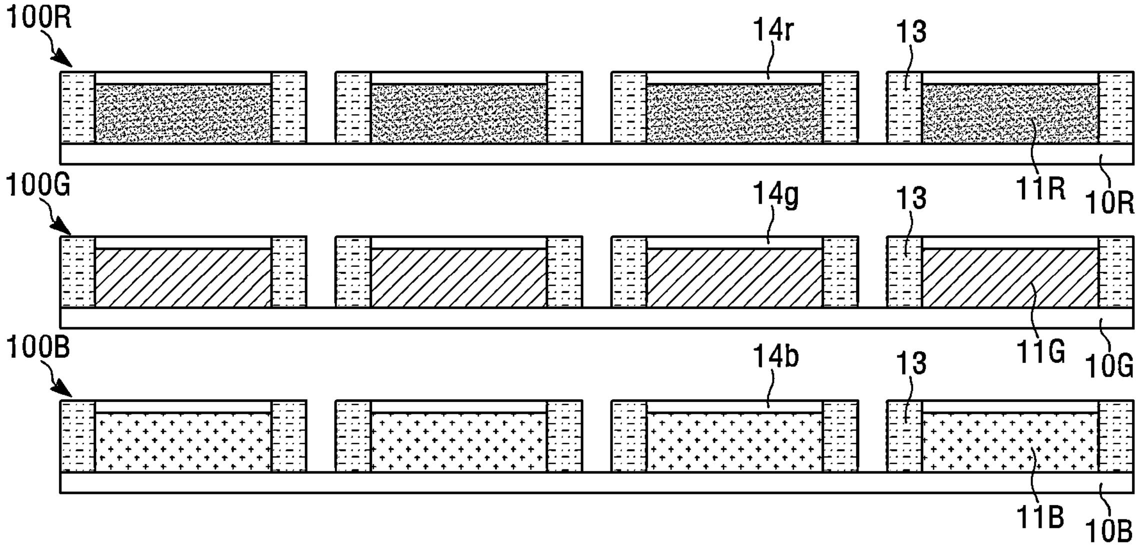

[Fig. 9]
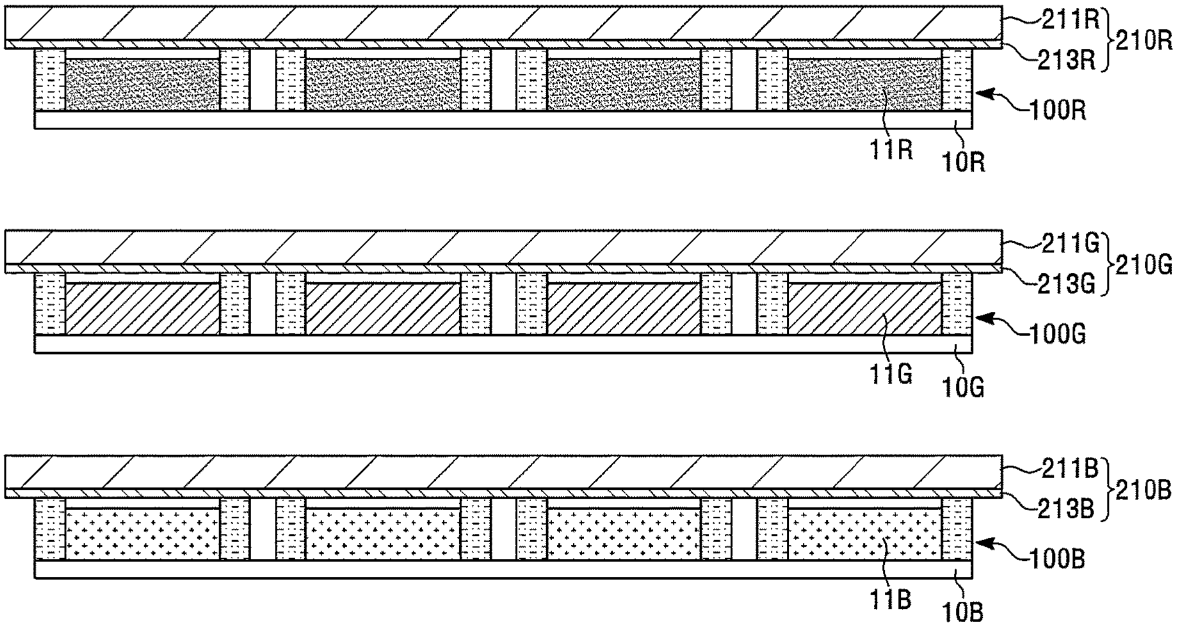
[Fig. 10]
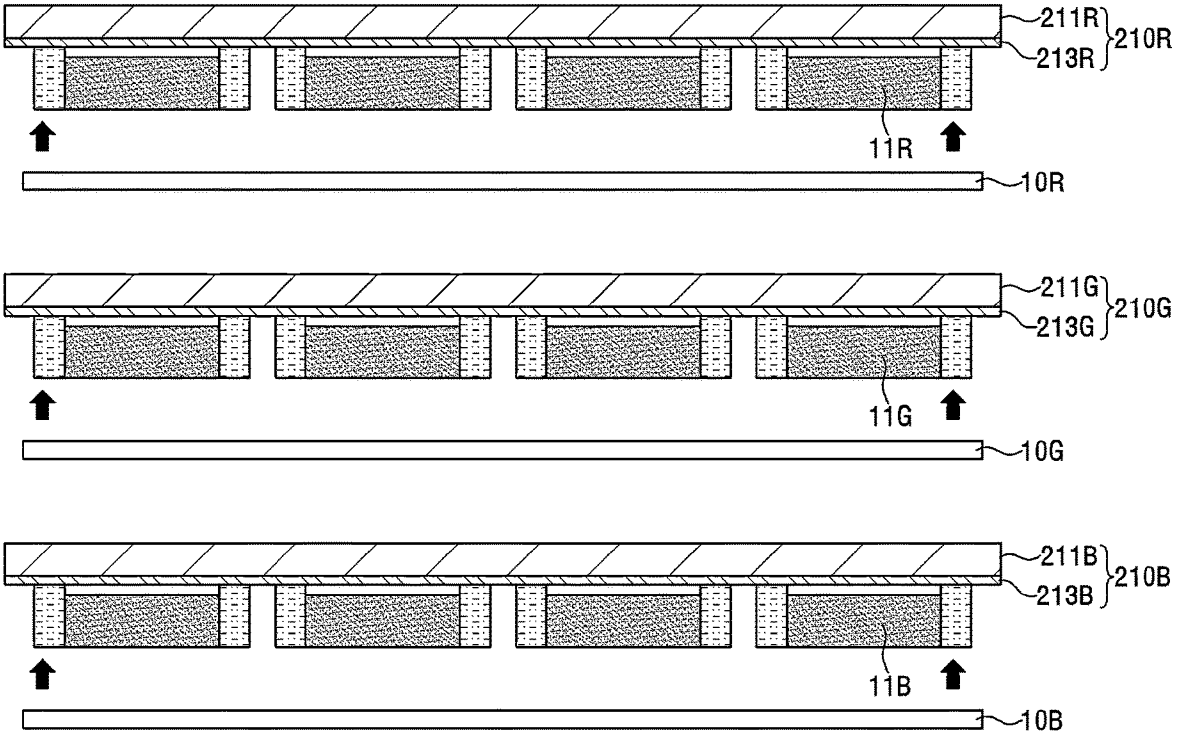

[Fig. 11]
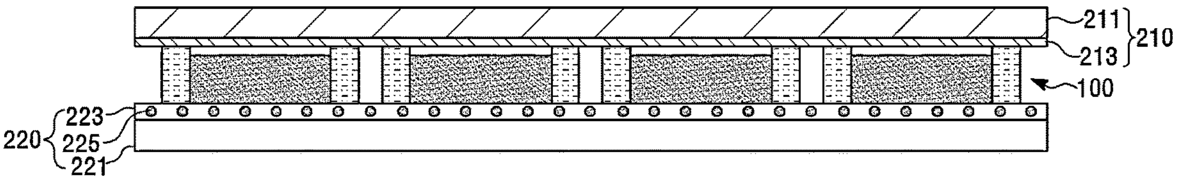
[Fig. 12]
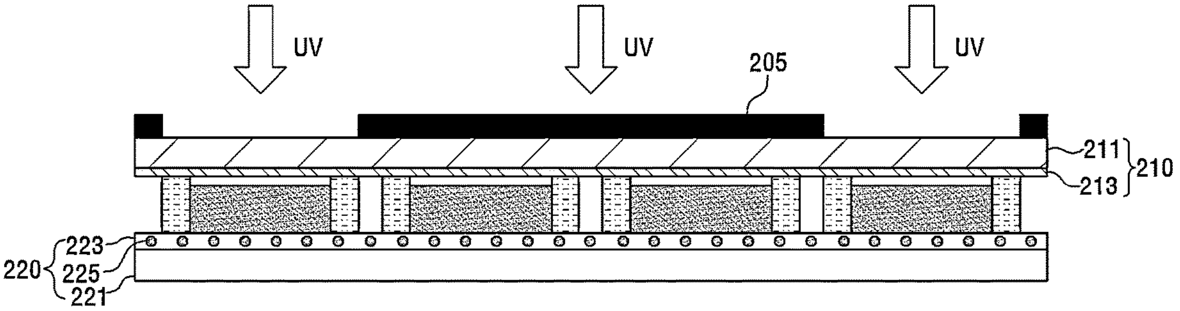
[Fig. 13]
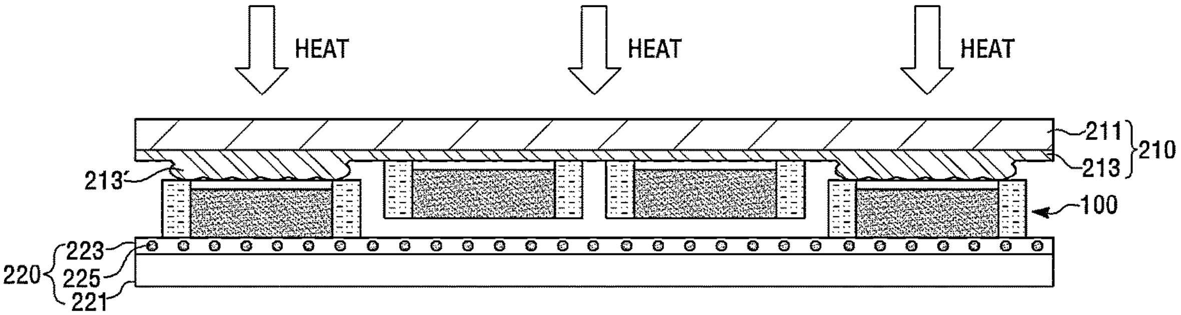
[Fig. 14]
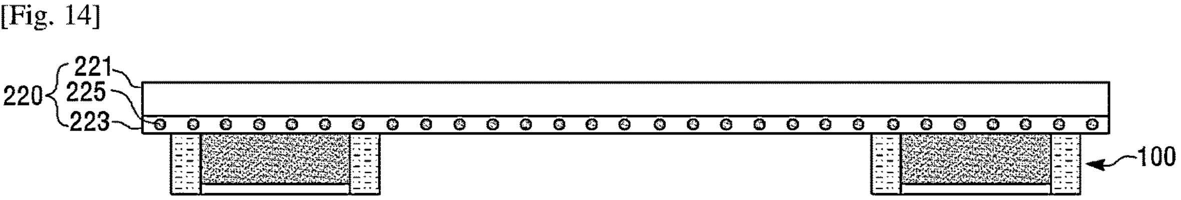

PHOTOSENSITIVE TRANSFER RESIN FOR TRANSFERRING AN LED CHIP, A METHOD OF TRANSFERRING AN LED CHIP USING THE PHOTOSENSITIVE TRANSFER RESIN, AND A METHOD OF MANUFACTURING A DISPLAY DEVICE USING THE SAME

A photosensitive transfer resin for transferring an LED chip, a method of transferring an LED chip using the photosensitive transfer resin, and a method of manufacturing a display device using the same.

CROSS-REFERENCE TO RELATED PATENT APPLICATIONS

The present application is a U.S. national stage application under 35 U.S.C. § 371 of PCT Application No. PCT/KR2021/004734, filed Apr. 15, 2021, which claims priority to Korean Patent Application No. 10-2020-0047960, filed Apr. 21, 2020. The disclosures of the aforementioned priority applications are incorporated herein by reference in their entireties.

TECHNICAL FIELD

The present invention relates to a photosensitive transfer resin using a technique of etching and separating LED chips formed on a wafer and transferring each separated chip to a carrier substrate, and a technique of selectively, sequentially or at time intervals transferring some of each chip transferred to a carrier substrate to another carrier substrate and a display panel using a photosensitive transfer resin. In addition, the present invention relates to a method of transferring an LED chip and a method of manufacturing a display device.

BACKGROUND TECHNOLOGY

A light emitting diode (LED) is one of light emitting elements that emit light when a current is applied. The light emitting diode may emit high-efficiency light at a low voltage, thereby having an excellent energy saving effect.

Recently, the luminance problem of the light emitting diode has been greatly improved. Accordingly, the light emitting diode is applied to various devices such as a backlight unit of a liquid crystal display device, an electronic display plate, an indicator, and home appliance.

The size of the micro light emitting diode (μ-LED) is very small at the level of 1 to 100 μm, and more than 25 million pixels are required to implement a 40-inch display device.

Therefore, a simple Pick & Place method takes at least a month to make a 40-inch display device.

A plurality of conventional μ-LEDs are manufactured on a sapphire substrate, and then micro light emitting diodes are transferred one by one to a glass or flexible substrate by a mechanical transfer method.

Since the μ-LEDs are picked up and transferred one by one, it is referred to as a 1:1 pick-up and place transfer method.

However, since the size of the μ-LED chip manufactured on the sapphire substrate is small and thin, there occurs such problems as damage to the chip, failure to transfer the μ-LED chip one by one, failure to align the chip, or tilt of the chip, and so on, during the pick and place transfer process transferring the μ-LED chip one by one.

In addition, there is a problem that the transfer process takes too long.

PRIOR ART

Patent Literature (Patent Document 1) Korean Patent No. 10-0853410

DETAILED DESCRIPTION OF THE INVENTION

Technical Task

The present invention is to provide a method capable of selectively transferring a plurality of chips formed or disposed on a base substrate by using a photosensitive resin using UV and heat.

In addition, the present invention provides a method for selectively transferring a plurality of chips formed on a base substrate using a predetermined photosensitive resin.

In addition, the present invention is to provide a method capable of transferring some of a plurality of chips transferred from a wafer to a first carrier substrate to a second carrier substrate using a photosensitive resin.

In addition, the present invention is to provide a method for manufacturing a display device by transferring a chip selectively transferred to a second carrier substrate using a foam to a display panel.

In addition, the present invention is to provide a method capable of manufacturing a display device having various sizes and various pitches between pixels.

In addition, the present invention is to provide a method for using a wafer having as many RGB pixels as possible in a limited area regardless of the resolution of a display device.

In addition, the present invention is to provide a method capable of quickly manufacturing a large-area display device.

An object to be achieved by the present invention is not limited to the above-mentioned objects, and other objects not mentioned will be clearly understood by those skilled in the art from the following description.

Technical Solution

The photosensitive transfer resin for transferring an LED chip according to the embodiment of the present invention is a photosensitive transfer resin prepared by mixing a photosensitive resin with a photoactive solution obtained by mixing a solvent and a photoactive agent powder. In addition, the photosensitive transfer resin may be expanded by heating without an exposure (development) process to peel off or transfer the LED chip adhered to the photosensitive transfer resin.

Here, the photosensitive transfer resin may be exposed to a specific region by mask and UV irradiation to form a photo-deteriorating layer, and the photo-deteriorating layer may be expanded by applying predetermined heat to selectively peel off or transfer only the LED chip located in the photo-deteriorating layer.

In addition, an LED chip transfer apparatus using a photosensitive resin according to an embodiment of the present invention includes: a substrate; and a photosensitive transfer resin layer formed on the substrate and made of a photosensitive resin which expands at a predetermined temperature. In addition, an LED chip may be disposed on the photosensitive transfer resin layer, and a specific region of the photosensitive transfer resin layer may be exposed by mask and UV irradiation to form a photosensitive layer, and the photosensitive layer may be expanded by applying predetermined heat and an adhesive force of the LED chip disposed on the photo-deteriorating layer is offset so that the LED chip is peeled off or transferred.

Here, the photosensitive transfer resin may be prepared by mixing a photosensitive resin with a photoactive agent solution obtained by mixing a solvent and a photoactive agent powder, and the photoactive agent powder is equal to or larger than 4% by weight, and the photosensitive transfer resin may be expanded by heating without a developing process to form a transferable state.

In addition, the LED chip transfer method using the photosensitive transfer resin according to the embodiment of the present invention includes the following steps:

- a substrate preparation step of preparing a substrate;
- a photosensitive transfer resin layer formation step of forming a photosensitive transfer resin layer including a photosensitive resin agent on the substrate;
- a photo-deteriorating layer formation step of forming a photo-deteriorating layer by positioning a mask on a rear side of the substrate so that only a specific region is exposed by UV irradiation; and
- a selective transfer step of selectively transferring an LED chip disposed on the photo-deteriorating layer to the target substrate by applying predetermined heat.

In addition, the manufacturing method of a display device according to an embodiment of the present invention includes the following steps:

- an LED chip formation step of forming a plurality of LED chips and a protective layer for passivation of the plurality of LED chips on a wafer;
- an etching step of etching the protective layer for each of the LED chips on the wafer;
- a first transfer step of transferring an LED chip array etched on the wafer and arranged in rows, columns, or matrices to a first carrier substrate on which a photosensitive transfer resin layer including a photosensitive resin agent is formed;
- a wafer removal step of removing the wafer from the LED chip array;
- a second transfer step of transferring the LED chip array from the first carrier substrate to a second carrier substrate having an EMC adhesive layer formed by mixing a second foam and an adhesive liquid; and
- a display panel transfer step of transferring the LED chip array from the second carrier substrate to the display panel.

The second transfer step includes the following steps:

- a photo-deteriorating layer formation step in which a mask is disposed on a rear side of the first carrier substrate and a specific region of the photosensitive transfer resin layer is exposed by UV irradiation; and
- a selective transfer step of selectively transferring the LED chip array disposed on the photo-deteriorating layer to the second carrier substrate by applying a predetermined heat.

The Effects of Invention

According to the aforementioned configuration of the present invention, there is an advantage in that a plurality of chips formed or disposed on a base substrate may be selectively transferred using predetermined UV, heat, and pressure.

In addition, there are advantages of separating R chips, G chips, and B chips formed on each wafer through etching, transferring each separated chip to the first carrier substrate, selectively transferring some of the chips to the second carrier substrate, and sequentially transferring each chip to the display panel.

In addition, the present invention may selectively transfer a plurality of chips formed on a base substrate through target exposure of a predetermined photosensitive resin layer.

In addition, since a plurality of selected light emitting elements may be quickly transferred to the display panel at once without controlling each micro-class light emitting element, there is an advantage of remarkably reducing costs and time of manufacturing of the display device.

In addition, when a large-area display device is manufactured, there is an advantage in that the transfer method may be changed in position and repeatedly executed to be manufactured quickly.

SIMPLE EXPLANATION OF THE DRAWING

FIG. 3 is a photograph illustrating an expanded state of a photosensitive transfer resin applied to the transfer of an LED chip according to an embodiment of the present invention.

FIG. 5 is a flowchart illustrating a method of manufacturing a display device according to an embodiment of the present invention.

FIG. 6 is a view illustrating chips formed on each wafer according to an embodiment of the present invention.

FIG. 7 is a process diagram of growing each Epi on each wafer according to an embodiment of the present invention.

FIG. 8 is a process diagram of etching each chip formed on each wafer in a single chip unit according to an embodiment of the present invention.

FIG. 9 is a process diagram of transferring the etched chip of FIG. 8 from a wafer to a first carrier substrate.

FIG. 10 is a process diagram of removing a wafer by an LLO technique.

FIGS. 11 to 14 are process diagrams illustrating a process S160 of selectively transferring the chip array shown in FIG. 5 from the first carrier substrate to the second carrier substrate.

EMBODIMENT FOR THE IMPLEMENTATION OF THE INVENTION

Figure 1A:
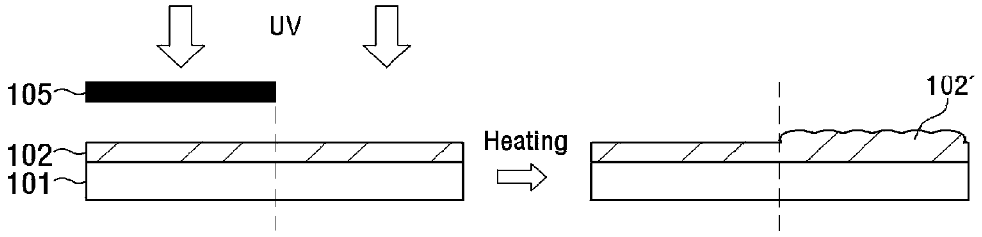
FIG. 1 is a schematic diagram illustrating an LED chip transfer method according to an embodiment of the present invention.

In the description of the embodiment, when described as being formed "upper (top) or lower (bottom)" of each element, two elements are directly in contact with each other or at least one other element is disposed between the two elements.

In addition, when expressed as "up (up) or down (down)", it may include not only upward but also downward meanings with respect to one element.

In the drawings, the thickness or size of each layer is exaggerated, omitted, or schematically illustrated for convenience and clarity of description. In addition, the size of each element does not fully reflect the actual size.

Chip, CSP, LED pixel CSP, and LED subpixel CSP used in the present invention may be defined as follows.

A chip is a concept that includes all of an LED chip, an RGB chip, an R chip, a G chip, a B chip, a mini LED chip, and a micro LED chip. Hereinafter, for convenience of description, the chip is described as an R chip, a G chip, or a B chip, but it should be noted that the chip is not limited to an R chip, a G chip, or a B chip.

A chip scale package (CSP) is a package that has recently attracted great attention in the development of a single chip package, and refers to a single chip package with a semiconductor/package area ratio of 80% or more.

The LED pixel CSP refers to a single package in which one LED pixel is CSP packaged using a red LED, a green LED, and a blue LED in units of one pixel.

The LED subpixel CSP refers to a single package in which each of the Red LED, Green LED, and Blue LED is CSP packaged in one LED subpixel unit.

The light emitting body formed on the wafer may be defined as an LED chip.

FIG. 1 is a schematic diagram illustrating an LED chip transfer method according to an embodiment of the present invention.

The present invention uses the principle of expansion of a photosensitive resin.

That is, when UV is irradiated to the photosensitive resin (PR), photoreaction occurs in internal novolac resins and photoactive agents, and acid is generated. When the wafer is raised on the Hop plate in a liquid state and the temperature is applied, only the UV-irradiated area of the acid is expanded, and the expansion occurs when the volume of the liquid Acid trapped inside the PR is rapidly increased by heat.

Here, a photoactive agent is added to increase the expansion force of the photosensitive resin so that the LED chip can be transferred. Accordingly, by increasing the amount of acid in the PR and increasing the PR expansion force, the cause of the defect during transfer is prevented.

Figure 1B:
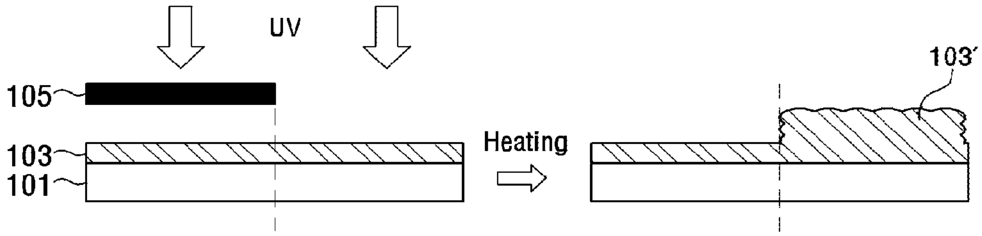

FIG. 1(A) is a schematic diagram of the degree of expansion of the photosensitive transfer resin by UV irradiation and heating when the content of the photoactive agent is relatively small, and FIG. 1(B) is a schematic diagram of the degree of expansion of the photosensitive transfer resin by UV irradiation and heating when the content of the photoactive agent is relatively large.

Photoreactive agents refer to substances in a comprehensive sense referring to any one of photoacid generators (PAG), photoactive compound (PAC), photoinitiator, photosensitive compound, and photoactive compound.

The photosensitive resin may consist of a novolac resin, a solvent, and a photoactive agent, the solvent may be PGMEA or Ethyle lactate, and the photosensitive transfer resin may be defined as a resin obtained by adding a photoactive agent solution to the photosensitive resin.

FIG. 1(A) shows a photosensitive transfer resin synthesized with equal to or smaller than 2% by weight of a photoactive agent, and FIG. 1(B) shows a photosensitive transfer resin synthesized with equal to or larger than 6% by weight of a photoactive agent.

The photosensitive transfer resins 102 and 103 are coated on the substrate 101, and the mask 105 is disposed on the upper side thereof to irradiate UV.

The photosensitive transfer resins 102 and 103 expand in the region to which the UV is irradiated, and the photosensitive transfer resins 102 and 103 do not expand in the region to which the UV is not irradiated.

That is, according to the mask pattern, the adhesive force of the LED chip attached to the photosensitive transfer resins 102 and 103 becomes zero selectively according to the presence or absence of the region of UV irradiation, so that the LED chip may be selectively transferred to another substrate.

However, in the case of (A), it is difficult to perform a transfer function completely due to the weak expansion force of the photosensitive transfer resin 102', and in the case of (B), the photosensitive transfer resin 103' has an expansion force enough to reduce the adhesive force of the LED chip to transfer to another substrate.

As a result, a considerable amount of photoactive agent solution is mixed with the photosensitive resin to form an exposed region by UV irradiation, and heat is applied to the exposed region to expand the photosensitive transfer resin of the exposed region. By doing so, it becomes possible to peel off the LED chip adhered to the exposed region or to transfer the LED chip onto another substrate. In addition, the photosensitive transfer resin only undergoes an exposure process, and it is possible to implement a material as a new application (LED chip transfer application) that does not undergo a development process.

Figure 2:
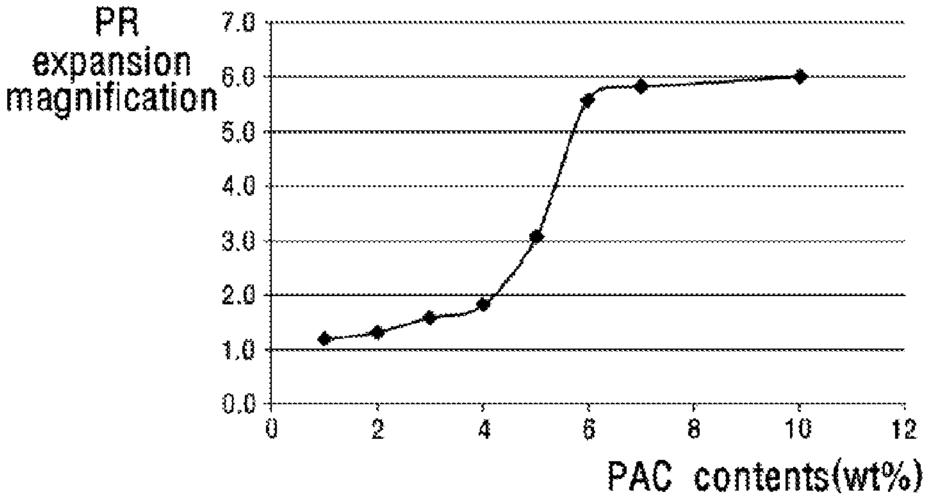
FIG. 2 is a graph illustrating an expansion magnification according to a content of a photoactive agent in the photosensitive transfer resin illustrated in FIG. 1.

FIG. 2 is a graph illustrating an expansion magnification according to a content of a photoactive agent in the photosensitive transfer resin illustrated in FIG. 1.

FIG. 2 is a graph showing the result of experimentally verifying the content of the photoactive agent in the photosensitive transfer resin and the expansion magnification of the photosensitive transfer resin.

The result values of the graph shown in FIG. 2 are as follows, and these indicate a relative value when heat is applied at the same UV irradiation amount and at the same temperature.

TABLE 1

| | PAC content (wt %) | | | | | | | |
|---|---|---|---|---|---|---|---|---|
| | 1 | 2 | 3 | 4 | 5 | 6 | 7 | 10 |
| Expansion magnification (times) | 1.2 | 1.3 | 1.6 | 1.8 | 3.1 | 5.6 | 5.8 | 6.0 |

It may be seen that the slope value is inclined at a range of about 4 wt % to about 6 wt %, and it may be seen that the expansion force of the maximum efficiency according to the PAC content is within this range.

As a result, when the PAC content is 4 to 6 wt %, the expansion magnification of the photosensitive transfer resin has an expansion force of 1.8 to 5.6 times, and this expansion force makes the adhesive force of the adhered LED chip becomes zero, and, this value may be recognized as a physical value for complete transfer.

When the PAC content is equal to or larger than 10 wt %, the expansion magnification is shown to converge 6.0 times, and thus, when the PAC content is equal to or larger than 4 wt %, it can be seen that expansion for LED chip transfer occurs.

FIG. 3 is a photograph illustrating an expanded state of a photosensitive transfer resin which is applied to the transfer of an LED chip according to an embodiment of the present invention.

A typical photosensitive material of the positive photosensitive resin applied to the present invention may be a naphthoquinone diazide-novolac resin.

When the photosensitive resin is mixed with equal to or larger than 4 wt % of a photoactive agent and irradiated with light, ketene with good reactivity is formed, and a positive image 104 is formed according to a reaction mechanism in which solubility is increased in a developer by the influence of nitrogen gas generated and the carboxylic acid formed by reacting ketene with moisture.

In the photograph of FIG. 3, the upper left photograph is a photograph 103 of a photosensitive transfer resin before UV irradiation, and the upper right photograph is a photograph in which a positive image 104 is formed by irradiating UV.

The lower photograph is an enlarged photograph of the positive image, that is, a portion in which the expansion region 103' is formed by irradiating UV.

This expansion region can be expanded at a specific position through a patterned mask, and can be implemented to have the maximum efficient expansion magnification by calculating an optimal mixing ratio of a photoactive agent. In addition, the expansion force by heat which the photosensitive transfer resin in accordance with the embodiment of the present invention uniquely has may serve to peel off or transfer the LED chip by disrupting the adhesive force of the LED chip.

Based on FIGS. 1 to 3, how the transfer process is actually performed will be described in detail with reference to FIG. 4. In addition, a transfer process from a wafer to a display panel will be described in more detail with reference to FIGS. 5 to 15.

FIG. 4 illustrates an LED chip transfer method according to an embodiment of the present invention.

As illustrated in FIG. 4, the LED chip transfer apparatus according to the present invention may include a substrate 101, a photosensitive transfer resin layer 103, and LED chips 100 and 100'.

The LED chips 100 and 100' may refer to RGB LED chips, R LED chips, G LED chips, B LED chips, and Chip Scale Packages (CSP). The LED chip pixel CSP may refer to a single package in which one LED pixel is CSP packaged. The LED subpixel CSP may refer to a single package obtained by CSP packaging each of the Red LED, Green LED, and Blue LED in one subpixel unit.

The substrate 101 may be made of any one of glass, quartz, artificial quartz, and metal, and is not particularly limited.

The photosensitive transfer resin layer 103 may be a photosensitive resin material containing equal to or larger than 4 wt % of a photoactive agent.

A process of peeling or transferring the LED chips 100 and 100' at a specific location will be described with reference to FIG. 4.

Figure 4A:
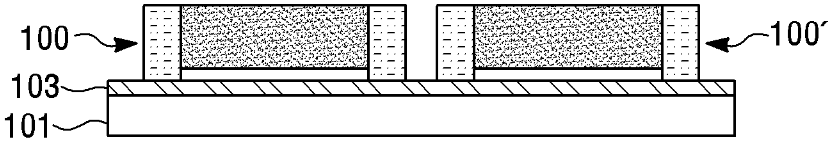
FIG. 4 illustrates an LED chip transfer method according to an embodiment of the present invention.

Referring to FIG. 4(A), a photosensitive transfer resin layer 103 is formed on the substrate 101, and LED chips 100 and 100' are disposed or transferred (meaning transfer from another substrate) on the photosensitive transfer resin layer 103.

Figure 4B:
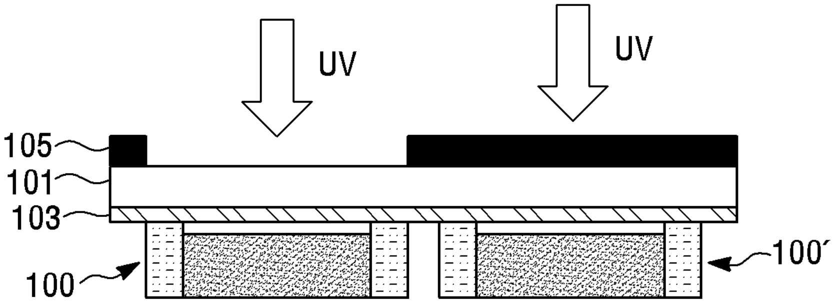

Referring to FIG. 4(B), a mask 105 for forming a pattern is disposed on a rear surface side of the substrate 101, and UV is irradiated through the mask 105.

The photosensitive transfer resin region exposed by mask 105 and UV irradiation is exposed by light as illustrated.

By mask 105 and UV irradiation, the photosensitive transfer resin has an exposed area and a non-exposed area, which means that the photosensitive transfer resin is a positive resin, and vice versa may be said when the photosensitive transfer resin is a negative resin.

Figure 4C:
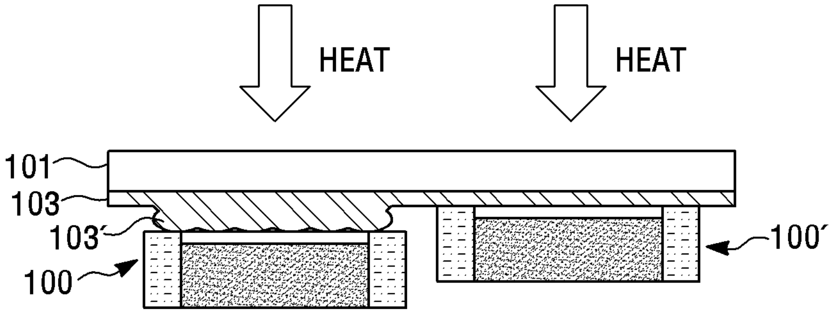

Referring to FIG. 4(C), when heat is applied from the rear surface side of the substrate 101 to a predetermined temperature, the exposed region in the photosensitive transfer resin layer 103 expands and the volume thereof expands, and the expanded expansion region 103' reduces adhesion of the LED chip 100 to zero.

Conversely, since there is no expansion in the unexposed region 103, the adhesive force to be adhered to the LED chip 100 is maintained as it is.

Figure 4D:
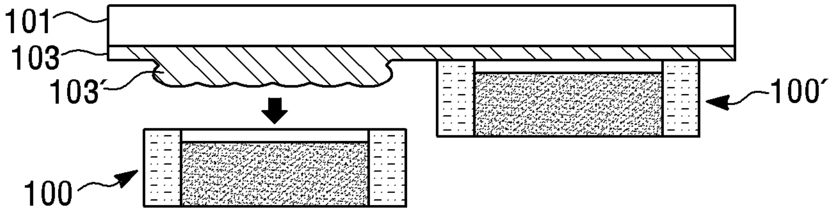

Referring to FIG. 4(D), the LED chip 100 adhered to the corresponding position is peeled off, and when there is a target substrate on the opposite side, it may be transferred to the target substrate. And, the LED chip 100' adhered to another position (a position other than the expansion region) is placed on the substrate as it is. Therefore, it is possible to selectively peel or transfer the LED chip as necessary.

Here, according to the photosensitive transfer resin, it is basically different from the photosensitive resin in the semiconductor process such as pattern formation in that there is only an exposure process by UV and an expansion process by heat, but no development process is performed.

Hereinafter, a method of transferring to a display panel using the LED chip transfer apparatus described above will be described in detail with reference to FIGS. 5 to 15.

FIG. 5 is a flowchart illustrating a method of manufacturing a display device according to an embodiment of the present invention.

Referring to FIG. 5, a method of manufacturing a display device according to an embodiment of the present invention includes the following steps:

- a step S110 of forming each of a plurality of chips on each wafer;
- a step S120 of etching the wafer for each chip;
- a step S130 of attaching a chip array of each wafer separated by unit of a chip to a first carrier substrate;
- a step S140 of removing a wafer by a laser lift off (LLO) process;
- a step S150 of preparing a second carrier substrate;
- a step S160 of selectively transferring the chip array from the first carrier substrate to the second carrier substrate;
- a step S170 of sequentially transferring the chip array selectively transferred to the second carrier substrate to the display panel; and
- a step S180 of removing the second carrier substrate.

A specific embodiments are as follows.

Before step S130, a step of preparing a photoactive agent solution may be added.

The photoactive agent solution is prepared by mixing 3 g of acetone and 1.6 g of a photoactive agent (PAC).

The photosensitive transfer resin layer is prepared by mixing 10 g of a photosensitive resin and 2 g of a PAC solution.

In step S130, a photosensitive transfer resin layer of the prepared photosensitive resin and PAC solution is coated on the first carrier substrate by a spin coating process.

The coated photosensitive transfer resin layer is first soft cured at 105° C. for 90 seconds, and then second soft cured at 105° C. for 60 seconds.

In step S130, the prepared photosensitive transfer resin layer is heated at 105 degrees for 60 seconds to transfer the LED chip on the wafer to the first carrier substrate.

In step S150, an expandable micro-capsule (EMC) adhesive layer in which a foam and an adhesive are mixed is applied on a glass substrate to prepare a second carrier substrate or to attach a heat peeling film.

In step S160, the second carrier substrate is coupled to the opposite side of the first carrier substrate, aligned using a mask aligner, and then UV of 2,000 mJ is irradiated, and heated to 100° C. for 20 seconds to heat and expand the photosensitive transfer resin layer on the first carrier substrate. In this case, the first carrier substrate is separated, and the transfer of the LED chip to the second carrier substrate is completed.

In steps S170 and S180, a TFT array is prepared, a solder paste is applied, and then the second carrier substrate and the TFT array are coupled. It is heated to 200 degrees for 90 seconds to foam the foam of the EMC adhesive layer of the second carrier substrate to separate the second carrier substrate and transfer the LED chip onto the display substrate (TFT array).

FIG. 6 is a view illustrating chips formed on each wafer according to an embodiment of the present invention.

As shown in FIG. 6, an embodiment of the present invention describes, as examples, three wafers each having an R chip, a G chip, and a B chip, but is not limited thereto.

Referring to FIG. 6, a plurality of light emitting elements 11R, 11G, and 11B emitting light of the same wavelength band are formed on each one of the wafers 10R, 10G, and 10B.

Here, the light emitting elements 11R, 11G, and 11B may be light emitting chips that emit red, green, and blue light.

A plurality of light emitting elements 11R, 11G, and 11B may be arranged on each of the wafers 10R, 10G, and 10B at equal intervals along a plurality of rows and columns.

The light emitting elements 11R, 11G, and 11B disposed at equal intervals are then transferred to the display panel in a row or column direction. Therefore, it is possible to reduce the manufacturing cost of a light emitting device by efficiently utilizing the entire area of the relatively expensive wafer.

Meanwhile, after forming a plurality of chips on each one of the wafers 10R, 10G, and 10B, the wafers may be separated for each chip through an etching process.

It is preferable that the pitch W between chips formed on each wafer 10R, 10G, and 10B is the same as the pitch between chips formed on the display panel or is set as a multiple of a proportional constant of a predetermined value.

This may facilitate transfer when chips are selectively transferred in units of matrix from a second carrier substrate to a display panel as described later.

FIG. 7 is a process diagram of growing each Epi on each wafer according to an embodiment of the present invention.

Referring to FIG. 7, Epis 11R, 11G, and 11B for emitting predetermined light are grown on one surface of each of the three wafers 10R, 10G, and 10B.

Here, the wafers 10R, 10G, and 10B may be any one of sapphire $Al_2O_3$, silicon, gallium arsenide (GaAs), gallium nitride (GaN), and zinc nitride (ZnN). However, the present invention is not limited thereto, and any substrate that may be used as a wafer may be used.

Pads 14*r*, 14*g*, and 14*b* are formed on each of the grown Epis 11R, 11G, and 11B, and a protective layer 13 for passivation of the Epis 11R, 11G, and 11B and the pads 14*r*, 14*g*, and 14*b* is formed.

Here, the pads 14*r*, 14*g*, and 14*b* are not expanded and may have a general pad size and shape. When forming the protective layer 13, it is preferable to form the pads 14*r*, 14*g*, and 14*b* to be exposed to the outside of the protective layer 13 in order to expand the area of the pad thereafter.

FIG. 7 shows cross-sectional views of A-A Section and B-B Section in FIG. 6, respectively. Preferably, a pair of (+) and (−) electrodes is formed for each chip under the Epi layer, and the electrodes may be formed vertically with respect to A-A section and may be formed left and right as necessary. The light emitting bodies formed on the wafers 10R, 10G, and 10B are electrically separated in units of chips, and in the present invention, they are referred to as LED chips and then transferred from wafers 10R, 10G, and 10B to the first carrier substrate.

FIG. 8 is a process diagram illustrating etching of each chip formed on each wafer in units of one chip according to an embodiment of the present invention.

Referring to FIG. 8, Epis 11R, 11G, and 11B and pads 14*r*, 14*g*, and 14*b* are formed on wafers 10R, 10G, and 10B, and a plurality of physically separated chips 100R, 100G, and 100B are formed by etching the protective layer 13 for each chip. Here, the protective layer 13 surrounding each chip and the chip is referred to herein as a chip. Of course, the protective layer 13 surrounding each chip and the chip may also be referred to as a pixel CSP or a sub-pixel CSP.

Here, in the etching process for each chip 100R, 100G, and 100B, wet or dry etching may be applied, and the shape of the LED chip is defined by the etching, and at this time, the wafers 10B, 10G, and 10B remain as they are.

In the following drawings, one chip 100R, 100G, and 100B is illustrated as a chip 100R, 100G, and 100B formed in FIG. 8, but is not limited thereto, and may be an array of chips 100R, 100G, and 100B etched in a row and column direction in FIG. 6.

Each of the chips 100R, 100G, and 100B may have a flip chip structure in which wires are unnecessary.

Instead of the wire, it may be electrically connected to the pads 14*r*, 14*g*, and 14*b*, and each of the chips 100R, 100G, and 100B may emit light of various colors according to external control signals through the pads 14*r*, 14*g*, and 14*b*.

In addition, in the present invention, each of the chips 100R, 100G, and 100B may be configured with subpixels for each R, G, and B to be packaged in a small size as a new concept manufactured in the form of CSP.

The R chip 100R, the G chip 100G, and the B chip 100B may constitute one light emitting element or a light emitting body.

By attaching each of the chips 100R, 100G, and 100B to the first carrier substrate in a plurality of rows and columns directions, a pre-process capable of transferring the chip array may be performed, selectively transferring from the first carrier substrate to the second carrier substrate, and the chip array arranged on the second carrier substrate may be sequentially transferred to a display panel to be described later.

As shown in FIG. 8, a process is performed where chip arrays etched in the form of chips 100R, 100G, and 100B are attached to a carrier substrate to remove wafers on each wafer 10B, 10G, and 10B. Thereafter, a process of selectively transferring from the first carrier substrate to the second carrier substrate and sequentially selectively transferring to the display panel will be described.

The following drawings will be described based on row (horizontal) arrangement in a chip array arranged in a matrix on the wafer of FIG. 6.

FIG. 9 is a process diagram of transferring the etched chip of FIG. 8 from the wafer to the first carrier substrate, and FIG. 10 is a process diagram of removing the wafer by an LLO technique.

FIGS. 9 and 10 are processes for removing wafers 10R, 10G, and 10B to transfer the etched chip to the first carrier substrate 210R.

The first carrier substrate 210R may have the same configuration as the transfer apparatus of FIG. 4.

Referring to FIG. 9, after the chip is separated in a matrix direction by etching (as shown in FIG. 8), the first carrier substrates 210R, 210G, and 210B are attached to LED chips 100R, 100G, and 100B in opposite directions of the wafers 10R, 10G, and 10B.

That is, the first carrier substrates 210R, 210G, and 210B are attached to the pads 14*r*, 14*g*, and 14*b* of the chips 100R, 100G, and 100B.

The first carrier substrates 210R, 210G, and 210B include substrates 211R, 211G, and 211B and photosensitive transfer resin layers 213R, 213G, and 213B.

The substrates 211R, 211G, and 211B may be made of any one of glass, quartz, artificial quartz, and metal, and the material is not particularly limited.

The photosensitive transfer resin layers 213R, 213G, and 213B are photosensitive resin materials containing equal to or larger than 4 wt % of a photoactive agent.

Referring to FIG. 10, when the wafers 10R, 10G, and 10B are removed by a laser lift off (LLO) process in FIG. 9, the LED chips 100R, 100G, and 100B are placed attached to the first carrier substrate 210R, 210G, and in this case, the chips 100R, 100G, and 100B are arranged in such a direction that the light emitting body is exposed in the opposite direction.

The first carrier substrates 210R, 210G, and 210B may include a first carrier substrate 210R on which an R LED chip array is formed, a first carrier substrate 210G on which a G LED chip array is formed, and a first carrier substrate 210B on which a B LED chip array is formed.

FIGS. 11 to 14 are exemplary diagrams for describing a process of selectively transferring the chip array shown in FIG. 5 from the first carrier substrate to the second carrier substrate.

FIGS. 11 to 14 will be described based on only one of the RGB LED chips shown in FIGS. 7 to 10.

Referring to FIG. 11, a second carrier substrate 220 is disposed on the first carrier substrate 210 on which the LED chip array 100 is formed.

The EMC adhesive layer 223 of the second carrier substrate 220 is brought into contact with the LED chips 100 to be attached to each other.

Here, the second carrier substrate 220 may be formed of an EMC adhesive layer 223 including a glass substrate 221 and a foam 225.

The foam 225 may be a micro-unit encapsulated foam material having foaming properties at a predetermined temperature.

The expandable micro-capsule (EMC) adhesive layer 223 may be a resin obtained by mixing the foam 225 with an adhesive liquid.

Referring to FIG. 12, a mask 205 is disposed on the rear surface of the glass substrate 211 of the first carrier substrate 210 in a state in which the first carrier substrate 210 and the second carrier substrate 220 are disposed to face each other with the LED chip 100 interposed therebetween.

The mask 205 may be a pre-patterned mask.

UV is irradiated while the mask 215 is disposed.

Only a specific region of the photosensitive transfer resin layer 213 may be exposed by the mask 215 pattern and UV irradiation.

Here, the degree of exposure of the 'exposure' may be adjusted according to the control of the UV exposure energy.

The adjusted exposed portion of the photosensitive resin according to the amount of UV irradiation may be referred to as a photo-deteriorating layer.

As heat is applied to the photo-deteriorating layer, the photosensitive transfer resin expands and the adhesive force of the LED chip becomes zero, thereby selectively transferring only the LED chip at the corresponding position.

Referring to FIG. 13, heat is applied to an upper portion of the first carrier substrate 210. In this case, the heat may mean an expandable temperature of the photosensitive transfer resin layer 213.

When the photosensitive transfer resin layer 213 reaches an expandable temperature by applying heat to the first carrier substrate 210, the photosensitive transfer resin layer 213 becomes a photosensitive transfer resin layer 213' in which the volume expands, and at this time, a position in which the volume expands may be the region where the photo-deteriorating layer which was provided in FIG. 12 exists.

The expanded photosensitive transfer resin layer 213' increases in volume, pushing the LED chip 100 by pressure (expansion force) generated when the volume expands, reduces the adhesive force of the LED chip 100 to zero, and the LED chip 100 adhered to the corresponding position is peeled off (or transferred) to the second carrier substrate 220.

Referring to FIG. 14, a state in which only a specific LED chip 100 is selectively peeled off and transferred from the first carrier substrate 210 to the second carrier substrate 220 may be seen.

FIG. 15 is a cross-sectional process diagram illustrating a process of transferring an LED chip array from the second carrier substrate 220 to a display panel 300.

Figure 15A:
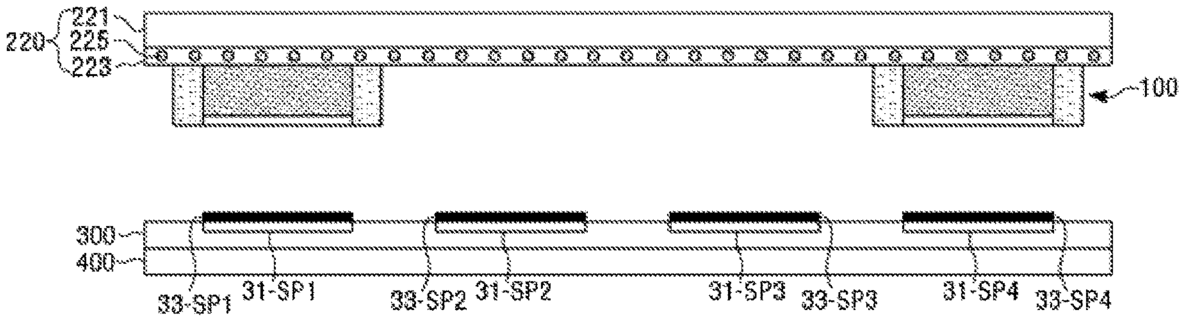
FIG. 15 illustrates a process S170 in which the LED chip array is transferred from the second carrier substrate of FIG. 14 to the display panel.

Referring to FIG. 15A, a solder paste 33 is applied onto a plurality of pads 31 of the display panel 300.

A TFT array substrate 400 may be disposed below the display panel 300.

Here, the solder paste 33 may be applied on pads 31-SP1 to 31-SP4 in rows 1 to 4, or the solder paste 33 may be selectively applied only to pads at positions where the LED chip 100 is to be selected and transferred.

The solder paste 33 may be applied on a plurality of pads 31 of the display panel 300 through various methods such as screen printing, dispensing, and jetting.

Figure 15B:
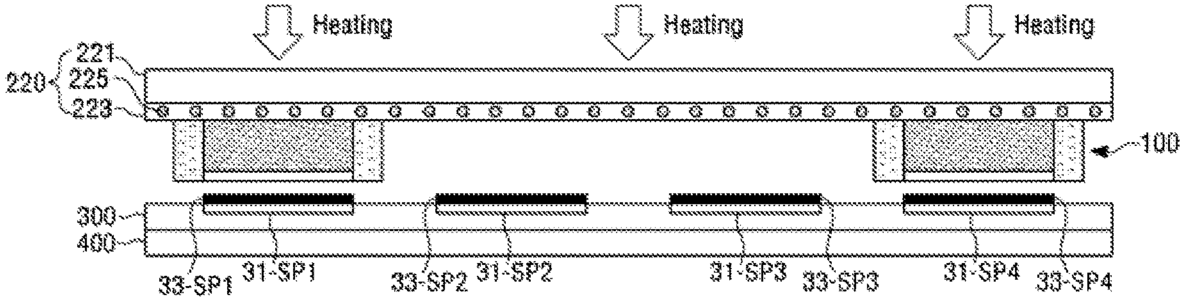

Next, referring to FIG. 15(B), the LED chip array 100 attached to the second carrier substrate 220 is disposed on the display panel 300, and the pad of the LED chip array 100 is arranged at positions of solder paste 33-SP1 to 33-SP4 applied on the pad 31 of the display panel 300.

Figure 15C:
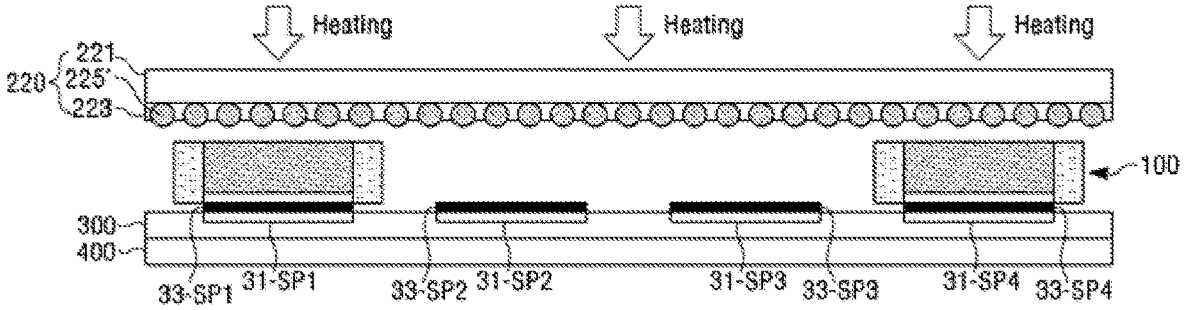

Next, referring to FIG. 15(C), heat is applied from an upper portion of the second carrier substrate 220.

In this case, heat refers to a temperature at which the foam 225 may be foamed.

The foam 225 expands in volume by heat and loses adhesive force between the LED chip 100 and the second carrier substrate 220, so that, by pushing the EMC adhesive layer 223 including the impregnated adhesive liquid at a constant pressure, the LED chip 100 located on the line of the EMC adhesive layer 223 may be transferred onto the display panel 300.

When these processes are repeatedly performed, it is possible to sequentially transfer R, G, and B LED chips sequentially to the display panel 300 in the order of time intervals.

Features, structures, effects, etc. described in embodiments are included in at least one embodiment of this invention and are not necessarily limited to one embodiment. Furthermore, the features, structures, effects, and the like illustrated in each embodiment may be implemented in combination or modification with respect to other embodiments by a person skilled in the art to which the embodiments belong. Therefore, it should be interpreted that the contents related to these combinations and modifications are included in the scope of the present invention.

In addition, although the embodiment has been mainly described above, this is merely an example and this invention is not limited, and it will be appreciated by a person skilled in the art that various modifications and applications not illustrated are possible within the scope not departing from the present invention. For example, each element specifically shown in the embodiment may be modified and implemented. And differences related to these modifications and applications should be interpreted as falling within the scope of the present invention as defined in the appended claims.

CODE'S EXPLANATION

10R, 10G, 10B: Wafer
100, 100R, 100G, 100B: LED
210, 210R, 210G, 210B: first carrier substrate.
220, 220R, 220G, 220B: second carrier substrate
300: display panel
400: TFT array substrate

The invention claimed is:

1. A photosensitive transfer resin for transferring an LED chip, comprising:

a blended composition of a photosensitive resin and a photoactive agent solution, wherein the photoactive agent solution being obtained by a mix of a solvent and a photoactive agent powder which is equal to or larger than 4% by weight, wherein the photosensitive transfer resin is configured such that after a photo-induced degradation layer containing a liquid acid is formed by ultraviolet (UV) irradiation, a predetermined heat is applied without a development process, thereby expanding the liquid acid in the photo-induced degradation layer to selectively transfer only the LED chip attached to the expanded photo-induced degradation layer, and wherein an adhesive strength of the photosensitive transfer resin after the UV irradiation is maintained at a level equivalent to an adhesive strength of the photosensitive transfer resin before the UV irradiation.

2. An LED chip transfer apparatus using a photosensitive transfer resin, comprising:

a substrate; and a photosensitive transfer resin layer formed on the substrate and made of a blended composition of a photosensitive resin and a photoactive agent solution which expands at a predetermined temperature, wherein the photoactive agent solution is a mix of a solvent and a photoactive agent powder which is equal to or larger than 4% by weight, wherein the photosensitive transfer resin is configured such that after a photo-induced degradation layer containing a liquid acid is formed by ultraviolet (UV) irradiation, a predetermined heat is applied without a development process, thereby expanding the liquid acid in the photo-induced degradation layer to selectively transfer only the LED chip attached to the expanded photo-induced degradation layer, and wherein an adhesive strength of the photosensitive transfer resin after the UV irradiation is maintained at a level equivalent to an adhesive strength of the photosensitive transfer resin before the UV irradiation.

3. The photosensitive transfer resin for transferring an LED chip of claim 1, wherein the photo-induced degradation layer is formed by exposing by UV light through a mask, which is configured to irradiate a selective region of the photosensitive transfer resin, and the photo-induced degradation layer is expanded by an application of predetermined heat to enable a selective transfer of only an LED chip located at the photo-induced degradation layer.

4. An LED chip transfer apparatus using a photosensitive transfer resin, comprising:

a substrate;

a photosensitive transfer resin layer formed on the substrate and made of a blended composition of a photosensitive resin and a photoactive agent solution which expands at a predetermined temperature, wherein the photoactive agent solution is a mix of a solvent and a photoactive agent powder which is equal to or larger than 4% by weight; and a photo-induced degradation layer of a specific region of the photosensitive transfer resin layer, wherein the photo-induced degradation layer is exposed by UV irradiation through a mask, which is configured to irradiate a selective region of the photosensitive transfer resin to generate an acid in liquid state, and the acid of the photo-induced degradation layer expands by an application of predetermined heat without a development process after the UV irradiation, wherein only the LED chip attached to the expanded photo-degrading layer is selectively transferred, and wherein an adhesive strength of the photosensitive transfer resin after the UV irradiation is maintained at a level equivalent to an adhesive strength of the photosensitive transfer resin before the UV irradiation.

* * * * *